United States Patent [19]

Basi

[11] 3,930,870

[45] Jan. 6, 1976

[54] SILICON POLISHING SOLUTION PREPARATION

[75] Inventor: Jagtar Singh Basi, Wappingers Falls, N.Y.

[73] Assignee: International Business Machines Corporation, Armonk, N.Y.

[22] Filed: Dec. 28, 1973

[21] Appl. No.: 429,418

[52] U.S. Cl. ............ 106/3; 134/3; 156/4; 204/129.1; 204/129.75; 252/79.2; 252/79.3; 427/309
[51] Int. Cl.² ..................................... C09K 13/04
[58] Field of Search ......... 106/3, 1; 117/123, 169, 117/227, 229; 134/3, 4, 28; 148/6.14; 156/4, 17; 204/325, 129.1, 129.75; 252/79.2, 79.3; 427/309

[56] References Cited
UNITED STATES PATENTS

| | | | |
|---|---|---|---|
| 2,410,322 | 10/1946 | Weesner et al. | 148/6.14 R X |
| 2,588,253 | 3/1952 | Lark-Horovitz et al. | 134/3 |
| 2,814,589 | 11/1959 | Waltz | 106/1 X |
| 3,088,889 | 5/1963 | Boda et al. | 204/129.75 |
| 3,155,556 | 11/1964 | Neunzig | 204/129.1 |
| 3,436,259 | 4/1969 | Regh et al. | 427/82 |

FOREIGN PATENTS OR APPLICATIONS 693,776   7/1953   United Kingdom ............... 148/6.14

Primary Examiner—Lorenzo B. Hayes
Attorney, Agent, or Firm—Sughrue, Rothwell, Mion, Zinn & Macpeak

[57] ABSTRACT

An improved process for preparing a polishing solution for use in the chemical-mechanical polishing of silicon comprising copper nitrate, ammonium fluoride, nitric acid and ammonium nitrate. The latter two components are added to the copper nitrate, the system mixed well and then the ammonium fluoride added. The process eliminates the need for settling, decantation or filtration during solution preparation and permits substantially lowered amounts of copper nitrate to be used for silicon polishing. The silicon polishing solution is also described.

16 Claims, No Drawings

SILICON POLISHING SOLUTION PREPARATION

BACKGROUND OF THE INVENTION

1. Field of the Invention

The present invention relates to polishing solutions for the chemical-mechanical (chem-mech) polishing of silicon, and methods for the preparation thereof.

2. Description of the Prior Art

U.S. Pat. No. 3,436,259, Regh, et al., Polishing of Silicon by the Cupric Ion Process, Mendel and Yang, Proceedings of the IEEE, Vol. 57, No. 9, September 1969, pages 1476, et seq., and "Silicon Planar Chemical Polishing", Regh and Silvey, Electrochemical Technology, March-April 1968, pages 155, et seq., all hereby incorporated by reference, relate to a process for polishing planar silicon surfaces to a high degree of surface perfection by chemical-mechanical polishing using, e.g., an aqueous solution containing cupric ions and fluoride ions. The present invention is an improvement thereon.

During the chem-mech polishing described in Regh, et al., displacement plating of copper for the silicon on the silicon planar surface occurs with the simultaneous and continuous wiping of the silicon surface resulting in the removal of copper metal from the high areas on the silicon surface. The components most commonly used to provide such polishing solution are cupric nitrate, providing cupric ions, and ammonium fluoride solutions, providing the fluoride anions.

Such polishing solutions are prepared by mixing cupric nitrate (for example, in the form of a 100 g/l solution of $CuNO_3 \cdot 3H_2O$) and ammonium fluoride (for example, as a 40 wt. % aqueous solution) at a 4:1 volume ratio, stirring the mixture well, allowing it to stand for 60–90 minutes and then decanting or filtering the copper-containing precipitate which forms and gradually separates from polishing solution under preparation.

The precipitate substantially reduces the cupric ion concentration in the polishing solution, generally in an amount on the order of 50 wt. %, and leads to a polishing solution which shows a lowered polishing rate. Further, the presence of solid particles in the polishing solution during polishing can cause surface damage to the silicon surface being polished.

In addition to the above defects, the separation of the precipitate, generally by the decantation or filtration, is a time consuming operation, and the disposal of the precipitate is a serious problem since the components involved are harmful to the ecology.

Attempts have been made to halt or reduce the precipitation of the copper compound, for example, acids such as nitric acid, sulfuric acid or acetic acid have been added to the polishing solution during its formation. The addition of these acids slows the precipitation, but the resultant polishing solutions are not acceptable for chem-mech polishing of a silicon planar surface because of their high acidity which produces unacceptable polished surfaces.

Other attempts to reduce the precipitation involved reducing the initial concentrations of copper nitrate and ammonium fluoride, but to obtain practically useful polishing solutions precipitate formation was still observed.

It would obviously be of substantial benefit to the art if the above defects in producing cupric cation/fluoride anion polishing solutions could be overcome.

SUMMARY OF THE INVENTION

It has now been discovered that a cupric nitrate/ammonium fluoride containing polishing solution for the chem-mech polishing of silicon can be prepared without the substantial precipitation of copper by mixing controlled amounts of ammonium nitrate and nitric acid with the cupric nitrate and then adding ammonium fluoride thereto.

The resultant polishing solution provides results equivalent or superior to those obtained with prior art cupric nitrate/ammonium fluoride polishing solutions after decantation or filtration.

It is thus one object of the present invention to provide a cupric nitrate/ammonium fluoride containing polishing solution by a process which does not result in the substantial precipitation of copper.

It is a further object of the present invention to provide cupric nitrate/ammonium fluoride containing polishing solutions wherein extended periods of time for settling, decantation or filtering or precipitate disposal are no longer necessary.

Yet a further object of the present invention is to provide a cupric nitrate/ammonium fluoride containing polishing solution with a high cupric ion content, which in turn may be utilized for the chem-mech polishing of planar silicon surfaces at a high polishing rate.

These and other objects of the present invention will be described and exemplified in greater detail by the following description.

DETAILED DESCRIPTION OF THE INVENTION

In the chem-mech polishing of single crystal silicon wafers using a mixture of cupric nitrate and ammonium fluoride solutions, the entire polishing process can be divided into three parts:

1. Solution preparation;
2. Polishing;
3. Cleaning the polished surfaces of undesirable surface impurities.

The present invention is directed primarily to an improvement in the solution preparation step, though it will be understood that the present invention inherently provides superior polishing and easier cleaning since more cupric ions can be present in the polishing solution of the present invention and undesirable precipitates are not deposited on the polished surface.

The exact reasons for the improved results obtained by the addition of ammonium nitrate and nitric acid to the cupric nitrate/ammonium fluoride system are not completely understood. The inventor theorizes, however, without wishing to be bound thereby, that cupric nitrate and ammonium fluoride initially react to produce basic cupric fluoride, nitric acid and ammonium nitrate, lowering the pH of the polishing solution being formed in accordance with the following equation:

$$Cu(NO_3)_2 + NH_4F + H_2O \rightleftharpoons Cu(OH)F + NH_4NO_3 + HNO_3$$

As soon as the pH of the solution reaches approximately 6, it is believed that the following sequences of reactions are initiated:

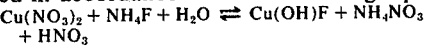
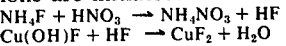

It is believed that the addition of nitric acid and ammonium nitrate reduce the formation of Cu(OH)F and control the pH in a manner which determines the precipitation kinetics and the polishing characteristics of the resultant polishing solution.

No matter what the correct reason for the unexpected results of the present invention, the essential materials used in the polishing solution and preparation procedure of the present invention are:

cupric nitrate, usually used as the trihydrate;
ammonium fluoride, usually added as an aqueous solution;
ammonium nitrate; and
nitric acid, generally concentrated (70%) nitric acid.

The amounts of cupric nitrate and ammonium fluoride present in the displacement plating solution of the present invention can be varied substantially. The amounts present will generally vary in proportion to the silicon to be polished.

Generally speaking, the amount of cupric ion which is present is the determinative factor in establishing the effectiveness of the polishing solution. For instance, a polishing solution having traces of cupric ion will act as a polishing solution where only small amounts of silicon, for example a few microns, are to be removed. Optimum silicon polishing is achieved at cupric nitrate concentrations of about 40 g/l. As the cupric nitrate ($Cu^{++}$) concentration increases, polishing rate increases, with a decrease in polishing rate being encountered with decreasing concentrations of cupric nitrate ($Cu^{++}$). The effect of cupric nitrate concentration on polishing rate is approximately linear with the polishing solution of the present invention [see FIG. 1 of the Regh and Silvey article earlier cited].

The bounds on the cupric nitrate concentration are not overly critical. While extremely low concentrations of cupric nitrate can be used with success, at concentrations excessively below about 20 g/l of cupric nitrate the polishing rate becomes slow and excessive process times will be required for many users. On the other hand, at excessively high cupric nitrate concentrations the polishing rate becomes too fast for convenient process control without any substantial benefits in silicon surface quality.

Balancing all of the above factors, preferred cupric nitrate concentrations will be from about 20 g/l to about 100 g/l.

While fluoride ions are necessary for the successful use of the polishing solution of the present invention, changes in fluoride ion content generally produce little changes in removal rates as compared to changes in the amount of cupric ion, although some effect is noted. The effect of fluoride ion concentration is approximately linear, as shown in FIG. 3 of the Mendel and Yang article earlier cited.

Optimum polishing is obtained with the use of ammonium fluoride sufficient to provide a fluoride ion content of about 2.1 to about 2.2 N. At increasingly lower amounts of ammonium fluoride an increasing tendency to etch is encountered and with greater concentrations no better results are obtained as compared to the use of about a 2.2 N fluoride ion concentration. If some etching is acceptable, it will be apparent fluoride ion normalities lesser than about 2.1 N can be used.

The amounts of ammonium nitrate and nitric acid required will vary from system to system depending upon the exact amounts of cupric nitrate and ammonium fluoride present. Generally speaking, however, variations in the ammonium fluoride content have little impact on this amount of ammonium nitrate and nitric acid used. On the other hand, with increasing amounts of cupric nitrate increases in ammonium nitrate and nitric acid are necessary, with the reverse being true with lesser amounts of cupric nitrate.

For 40 g/l cupric nitrate and 81 g/l ammonium fluoride, optimum results are obtained with about 6 to about 12 cc/l of 70% nitric acid. The following results illustrate the effect of nitric acid variations for such a system further including 20 g/l ammonium nitrate.

| Amount of $HNO_3$ (70%) cc/l | Silicon Polishing Rate (mils/hour) |
|---|---|
| 0 | 3 |
| 5 | 5 |
| 6 | 8.2 |
| 7 | 8.4 |
| 8 | 8.4 |
| 9 | 8.8 |
| 12 | 10.0 |

Silicon polishing was at 88°–92°F., and no "orange peeling" was encountered at any nitric acid concentration.

For a given cupric nitrate-ammonium fluoride-ammonium nitrate system, decreasing amounts of nitric acid increase the tendency towards copper precipitation and increasing amounts of nitric acid increase the tendency towards "orange peeling" and pitting. Optimum nitric acid concentration for any particular system can be determined by a few trial preparations, usually starting with low nitric acid concentrations and increasing, if necessary, the concentration until no precipitation is observed.

For a system as earlier described, i.e., 40 g/l cupric nitrate, 81 g/l ammonium fluoride and 6-12 cc/l concentrated (70%) nitric acid, the optimum amount of ammonium nitrate is 20 g/l. This value is not, of course, limitative, so long as the following general trends are considered.

For any system, increasing amounts of ammonium nitrate over the amount needed to prevent copper precipitation serve no beneficial purpose, and can merely be considered a waste of ammonium nitrate. On the other hand, with decreasing amounts of ammonium nitrate in an otherwise constant composition system there is a growing tendency for copper precipitation, which should be avoided.

Balancing all factors, the ammonium nitrate concentration is most preferably at least about 10 g/l.

Variations of the nitric acid content do not have any substantial effect on the ammonium nitrate concentration, and vice versa.

The interrelationship between the components of the silicon polishing solution are summarized in the Table on the following page.

TABLE

| Component | Preferred Concentration | Optimum Concentration | Effect of Reducing Concentration | Effect of Increasing Concentration |
|---|---|---|---|---|
| Cupric Nitrate (trihydrate) | At least about 20 g/l | About 40 g/l | 1. Lowers polishing rate<br>2. Less nitric acid and ammonium nitrate needed | 1. Increases polishing rate<br>2. More nitric acid and ammonium nitrate needed |

TABLE-continued

| Component | Preferred Concentration | Optimum Concentration | Effect of Reducing Concentration | Effect of Increasing Concentration |
|---|---|---|---|---|
| Ammonium Fluoride | To provide fluoride ion normality of about 2.1 to about 2.2 N | To provide fluoride ion normality of about 2.1 to about 2.2 N | No substantial effect; if excessively lowered etching tendency shown | No substantial detrimental or beneficial effect. |
| Nitric Acid (70%) | About 6 to about 12 cc/l | About 8 cc/l | Tendency towards copper precipitation increases with lowering concentrations | Tendency towards "orange peeling" at excessively high concentrations |
| Ammonium Nitrate | At least about 10 g/l | About 20 g/l | Tendency towards copper precipitation increases with lowering concentrations | No substantial detrimental or beneficial effect |

The polishing solution of the present invention is formed by mixing the cupric nitrate, ammonium nitrate and nitric acid in water and then adding the ammonium fluoride. The mixing order is not important so long as the ammonium fluoride is mixed with a "preformed" aqueous solution of the three other components. Since the ammonium fluoride will generally be added as an aqueous solution, the water present should be taken into account in establishing the mixing proportions.

In a specific exemplification, 40 g of cupric nitrate (trihydrate), 20 g of ammonium nitrate and 8 cc of 70% nitric acid were mixed well in water to form a solution and thereafter 81 g of ammonium fluoride in 190 ml of water added thereto, the total volume being 1 liter, and mixed well.

The resulting polishing solution could be immediately used for the polishing of silicon as described in the Regh, et al. patent earlier cited as there was no need for settling, decantation, filtration or the like.

To obtain comparable polishing results at identical conditions without nitric acid or ammonium nitrate, it was necessary to form a polishing solution by starting with 80 g/l of cupric nitrate and 88 g/l of ammonium nitrate.

While the invention has been particularly shown and described with reference to the preferred embodiment thereof, it will be understood by those skilled in the art that various changes in form and details may be made therein without departing from the spirit and scope of the invention.

What is claimed is:

1. In a process for preparing a silicon chemical-mechanical polishing solution comprising cupric nitrate and ammonium fluoride in water in an amount effective to chemical-mechanical polish silicon, the improvement which comprises bringing cupric nitrate, ammonium nitrate and nitric acid into aqueous solution and then adding thereto ammonium fluoride, said nitric acid and ammonium nitrate being present in an amount effective to prevent copper precipitation.

2. The process of claim 1 where the cupric nitrate is in the trihydrate form and the amount of cupric nitrate is greater than about 20 g/l of polishing solution.

3. The process of claim 2 where the amount of cupric nitrate is less than about 100 g/l of polishing solution.

4. The process of claim 2 where the ammonium fluoride is present in a concentration sufficient to provide a fluoride ion normality of about 2.1 to about 2.2 N in the polishing solution.

5. The process of claim 2 where the nitric acid is present in an amount of from about 6 to about 12 cc/l of polishing solution, calculated as 70% nitric acid.

6. The process of claim 5 where the ammonium nitrate is present in an amount greater than about 10 g/l of polishing solution.

7. The process of claim 2 where the polishing solution comprises:
about 20 to about 100 g/l of cupric nitrate trihydrate;
sufficient ammonium fluoride to provide a fluoride ion normality of about 2.1 to about 2.2 N;
from about 6 to about 12 cc/l of nitric acid, calculated as 70% nitric acid; and
greater than about 10 g/l of ammonium nitrate.

8. In a silicon chemical-mechanical polishing solution comprising cupric nitrate and ammonium fluoride in water in an amount effective to chemical-mechanical polish silicon, the improvement which comprises said silicon chemical-mechanical polishing solution further comprising nitric acid and ammonium nitrate in an amount effective to prevent the precipitation of copper from said cupric nitrate, said cupric nitrate being present in an amount which would cause copper precipitation but for the presence of said nitric acid and ammonium nitrate.

9. The chemical-mechanical polishing solution of claim 8 where the cupric nitrate is in the trihydrate form and the amount of cupric nitrate is greater than about 20 g/l of polishing solution.

10. The chemical-mechanical polishing solution of claim 9 where the amount of cupric nitrate is less than about 100 g/l of polishing solution.

11. The chemical-mechanical polishing solution of claim 9 where the ammonium fluoride is present in a concentration sufficient to provide a fluoride ion normality of about 2.1 to about 2.2 N in the polishing solution.

12. The chemical-mechanical polishing solution of claim 9 where the nitric acid is present in an amount of from about 6 to about 12 cc/l of polishing solution calculated as 70% nitric acid.

13. The chemical-mechanical polishing solution of claim 12 where the ammonium nitrate is present in an amount greater than about 10 g/l of polishing solution.

14. The chemical-mechanical polishing solution of claim 9 where the polishing solution comprises:
about 20 to about 100 g/l of cupric nitrate trihydrate;
sufficient ammonium fluoride to provide a fluoride ion normality of about 2.1 to about 2.2 N;
from about 6 to about 12 cc/l of nitric acid, calculated as 70% nitric acid; and
greater than about 10 g/l of ammonium nitrate.

15. The process of claim 7 where said ammonium nitrate is present in an amount up to about 20 g/l.

16. The chemical-mechanical polishing solution of claim 14 where the ammonium nitrate is present in an amount of up to about 20 g/l.

* * * * *